United States Patent [19]

Noguchi

[11] Patent Number: 4,730,314
[45] Date of Patent: Mar. 8, 1988

[54] LOGIC ANALYZER

[75] Inventor: Kazuo Noguchi, Kumagaya, Japan

[73] Assignee: Advantest Corporation, Tokyo, Japan

[21] Appl. No.: 797,205

[22] Filed: Nov. 12, 1985

[30] Foreign Application Priority Data

Nov. 12, 1984 [JP] Japan ................................ 59-238994

[51] Int. Cl.⁴ ............................................. G09G 1/08
[52] U.S. Cl. .................................... 371/16; 324/73 R;
371/5
[58] Field of Search ....................... 371/15, 20, 16, 29,
371/5; 324/73 R, 73 AT; 377/20; 375/10, 107;
364/200, 900, 551, 569; 370/108; 328/55

[56] References Cited

U.S. PATENT DOCUMENTS

| | | | |
|---|---|---|---|
| 4,364,036 | 12/1982 | Shimizu | 364/900 |
| 4,425,643 | 1/1984 | Chapman | 324/73 R |
| 4,434,488 | 2/1984 | Palmquist | 371/29 |
| 4,481,647 | 11/1984 | Gombut | 370/108 |
| 4,538,235 | 8/1985 | Henning | 377/20 |
| 4,541,100 | 9/1985 | Sutton | 375/10 |
| 4,559,636 | 12/1985 | Goldman | 324/73 R |

*Primary Examiner*—Michael R. Fleming
*Attorney, Agent, or Firm*—Staas & Halsey

[57] ABSTRACT

A state analysis section which loads first input data into a first data memory for each change in state of the data and a timing analysis section which loads second input data into a second data memory with a fixed period are provided. The loading intervals of the first input data are measured by a data interval measuring circuit and each measured data loading interval is stored in a data loading interval memory. When the first and second input data are detected to match preset data in first and second trigger detectors, respectively, the detected outputs are delayed by first and second delay means, and by the outputs of the first and second delay means, the first and second data memories are stopped from the data loading thereinto. The time difference between the stopping of the data loading into both the data memories is measured by a time difference measuring circuit and the measured time difference is stored in a time difference memory. When one of the data stored in one of the first and second data memories is specified by specifying means, data in the other data memory corresponding to the point of time at which the specified data was loaded is detected using the data loading intervals stored in the data loading interval memory and the time difference stored in the time difference memory.

23 Claims, 28 Drawing Figures

PRIOR ART
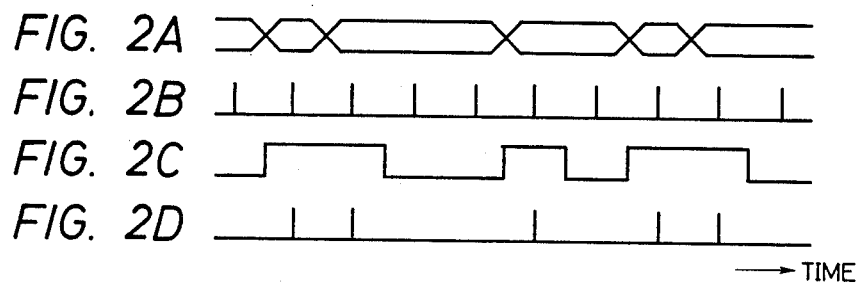
FIG. 3A
PRIOR ART
FIG. 3B
PRIOR ART
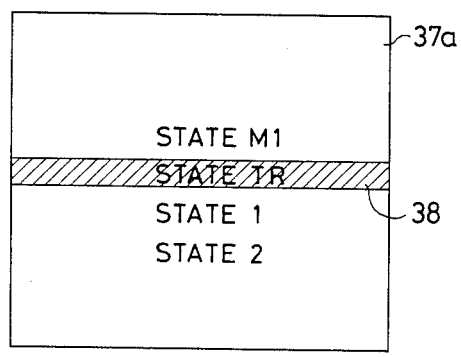
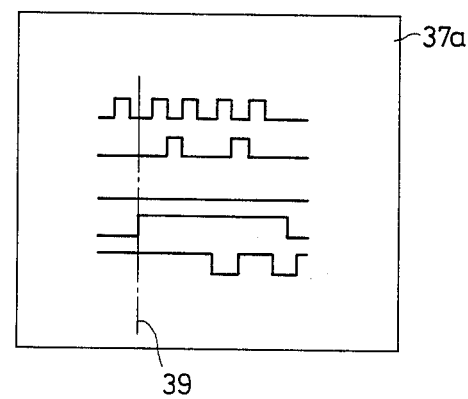

FIG. 5
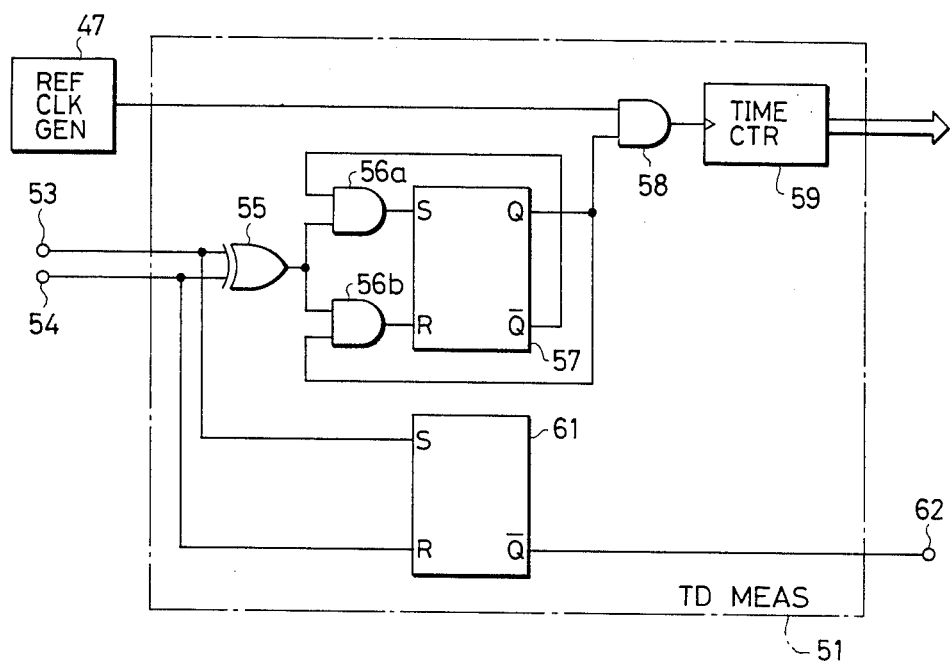
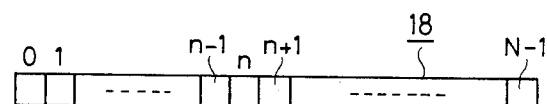
FIG. 6A
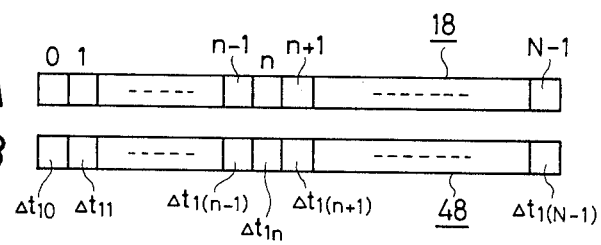
FIG. 6B
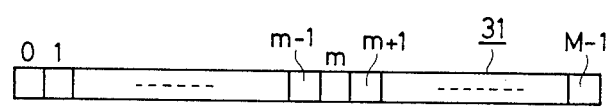
FIG. 6C
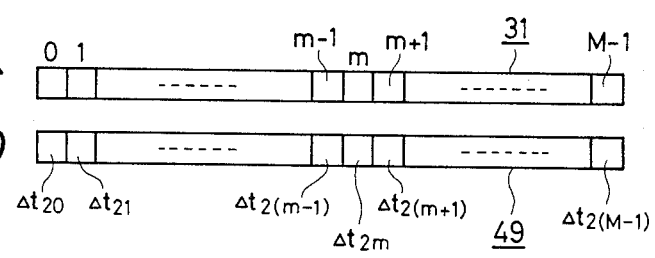
FIG. 6D

→ TIME

LOGIC ANALYZER

BACKGROUND OF THE INVENTION

The present invention relates to a logic analyzer for testing a logic circuit such as a microcomputer.

For instance, in the case where a logic circuit employing a microcomputer is tested by a conventional logic analyzer of this kind as to whether algorithmic operation of the microcomputer, i.e. software works correctly or not, a check is made to see how each step of a program works. In this case, an address for reading out an instruction of the program, the instruction and various data states are input from the logic circuit under test into the logic analyzer, for example, for each address and are displayed. Accordingly, the data loading interval is usually not fixed. Such a test is called a state analysis.

On the other hand, in the case of checking how hardware of the logic circuit operates, the logic analyzer reads the outputs from the logic circuit under test at equal intervals and checks what waveforms they take. This is called a timing analysis.

Conventionally, since the results of the state and the timing analysis are individually displayed, it is difficult to precisely recognize their interrelationships. For the same reason, the prior art logic analyzer does not permit a correct recognition of the results of a plurality of state analyses.

Such conventional logic analyzers are disclosed, for instance, in U.S. Pat. Nos. 4,425,643 and 4,434,485 and U.S. patent applications Ser. Nos. 719,154 (filed on Apr. 2, 1985), 737,466 (filed on May 24, 1985) and 739,467 (filed on May 24, 1985). As shown in FIG. 1, a state analysis section 10 is supplied at an input port 11 with first input data from a logic circuit under test. The first input data is loaded as set logic levels into a temporary memory 13 via a level converter 12 for removing analog components as required. Clock pulses synchronized with those of the first input data to the input port 11 and qualifiers indicating change portions of the data are applied to an input port 14. The input external clock pulses synchronized with the data and the qualifiers are similarly converted by a level converter 15 to logic levels for input into a sampling clock generator 16. The sampling clock generator 16 creates sampling clock pulses 17 corresponding to the change portions of the first input data. By the sampling clock pulses 17, the data from the level converter 12 is loaded into the temporary memory 13. For instance, the first input data to the input port 11, the clock pulses synchronized therewith and the qualifiers are such as shown in FIGS. 2A, B and C, respectively, and the sampling clock pulses have a one-to-one correspondence to the first input data, as depicted in FIG. 2D.

The output of the temporary memory 13 is applied to a data memory 18 and a trigger detector 19. The sampling clock pulses 17 are provided to an address counter 21 wherein they are counted. Upon each occurrence of the sampling pulses 17, the data from the temporary memory 13 is written into the data memory 18 which is addressed by the count value of the address counter 21. Incidentally, the address of the address counter 21 is updated after the write is effected in the data memory 18. The address counter 21 and the data memory 18 have addresses of the same number, and when the address counter 21 overflows, the write is effected again in the data memory 18 starting at the zero address. In this way, the data memory 18 is successively supplied with the first input data from the input port 11.

On the other hand, the trigger detector 19 has set therein trigger data, and when the input data from the temporary memory 13 matches the set trigger data, a delay counter 22 serving as a delay means starts to count the sampling clock pulses 17. When having counted a set value, the delay counter 22 overflows, that is, yields a delayed output, by which the address counter 21 is stopped from counting, that is, the data input to the data memory 18 is stopped. Thus input data which precedes and follows the same data as the set data (the trigger data) are loaded into the data memory 18.

A timing analysis section 23 is supplied with second input data from a second data input port 24. The second input data is converted by a level converter 25 to a logic level and then input into a temporary memory 26. The write in the temporary memory 26 is effected by an internal sampling clock. That is, the second input data from the level converter 25 is loaded into the temporary memory 26 by sampling clock pulses 28 of a fixed frequency which is available from a sampling clock generator 27. The sampling clock pulses 28 are supplied as well to an address counter 29, by which they are counted. The output of the temporary memory 26 is provided to a data memory 31 and a trigger detector 32. Upon each occurrence of the sampling clock 28, the output of the temporary memory 26 is stored in the data memory 31 which is addressed according to the count value of the address counter 29. The trigger detector 32 detects agreement between its set trigger data and the output of the temporary memory 26. When they match, a delay counter 33 as a delay means starts its operation to count the sampling clock pulses 28. Having counted clock pulses of a number corresponding to a preset delay, the delay counter 33 overflows, that is, produces an output, by which the counting operation of the address counter 29 is stopped.

A control section 34, which is equipped with a microcomputer, for instance, is connected via an interface bus 35 with the data memories 18 and 31, the trigger detectors 19 and 32, the address counters 21 and 29 and the delay counters 22 and 33. The control section 34 is able to set data to be triggered (trigger data) in the trigger detectors 19 and 32, to read out the stored contents of the data memories 18 and 31 controlling the address counters 21 and 29 and to set delay data in the delay counters 22 and 33. The trigger data and delay data are entered through a keyboard (input means) 36, and they are set in the trigger detectors and the delay counters under control of the control section 34. The stored contents of the data memories 18 and 31 can be displayed on a display device 37.

With the above arrangement and operation, the first and second input data before and after the detection of the set trigger data of the trigger detectors 19 and 32 are stored in the data memories 18 and 31, and either one of the data is displayed on the display device 27. For example, in the case of displaying the stored contents of the data memory 18, data indicating various states of program are displayed in the respective lines on a display screen 37a, the trigger data set in the trigger detector 19, that is, the trigger position is indicated by a lateral marker 38 and the states before and after the preset trigger data, for example, steps of the program are sequentially displayed, as shown in FIG. 3A.

The stored contents of the data memory 31 in the timing analysis section 23 are displayed on the display screen 37a of the display device 37, as depicted in FIG. 3B. The states of outputs of the logic circuit (logic waveforms) are displayed with the lateral direction as the time axis, and the logic outputs of respective parts are arranged in the vertical direction. In this instance, the trigger data detected by the trigger detector 32 corresponds to a set of those logic states on a broken line marker 39 in the vertical direction, that is, in a direction perpendicular to the time axis.

Conventionally, the data of the data memory 18 in the state analysis section 10 and the data of the data memory 31 in the timing analysis section 23 are selectively displayed on the display device 37, one at a time through manipulation of the keyboard 36, as described above.

If corresponding trigger data are preset in the respective trigger detectors 29 and 32, then the first input data to the input port 11 and the second input data to the input port 24 will correspond to each other at the time of trigger generation by the trigger detectors 29 and 32. Accordingly, the status (data) indicated by the trigger marker 38 in the data display of the state analysis section 10 and the data indicated by the trigger marker 39 in the display of the timing analysis section 23 can be correlated to each other. However, the state analysis section 10 inputs data, for example, upon each change in the address or status data, as described previously, and the time axis in the vertical direction in FIG. 3A is not always graduated at regular intervals, in other words, the time intervals between data displayed at adjacent lines are usually not fixed. The display in FIG. 3A merely indicates data in order of occurrence not in terms of time.

In the display for the data in the timing analysis section 23, shown in FIG. 3B, respective parts of the display on the time axis, i.e. in the horizontal direction, correspond to data sampled at equal time intervals, so that the position of the trigger marker 39 corresponds to the point at which its data was input. Therefore, even if provision is made for making the trigger markers 38 and 39 indicate the same point of time, respective data for the state analysis and the timing analysis, occurring before and after the trigger markers, cannot be made to correspond in terms of time. Thus it is difficult to check the interrelationships of the both displays.

Sometimes the data displayed on the display device 37 is selectively read out specifying a desired place with a cursor. In the case where the state analysis section 10 and the timing analysis section 23 are both provided, or where two state analysis sections are provided, it would be very convenient if such a desired part of data of one analysis section specified by the cursor and that part of data of the other analysis section corresponding thereto in time could be displayed simultaneously. But the conventional logic analyzer has no such capability.

Furthermore, it would also be very convenient if such corresponding data of the two analysis sections could always be displayed together during scrolling, but this function has not been implemented yet.

SUMMARY OF THE INVENTION

It is an object of the present invention to provide a logic analyzer which is capable of providing a clear indication of the time or temporal relationship between input data available from a plurality of analysis sections operating on different sampling clocks.

According to the present invention, simultaneously with the loading of first input data the loading intervals are measured by a first interval measuring circuit and stored in a first input interval memory. The time interval between delayed outputs of first and second delay means which delay outputs of first and second trigger detectors, that is, the time difference between points of stopping the data input to first and second data memories is measured by a time difference measuring circuit and stored in a time difference memory. When a desired one of data in one of the first and second data memories is specified by a specifying means, data stored in the other data memory which corresponds in time to the specified data is output using the time difference stored in the time difference memory and the input interval stored in the input interval memory. To perform this, for example, the time interval between the input stop point of the data memory having stored therein the specified data and the input stop point of the specified data is obtained as a reference time interval, and a value k is determined such that the sum of the time interval from the input stop point of the other data memory back to the input point of the Kth previous data and the time difference, including its sign, between the input stop points of the both data memories will be close to the reference time interval, and the Kth previous data is used as the corresponding data.

In the case of specifying the data by a cursor, the corresponding data is indicated by another cursor and the respective data of the first and second data memories are simultaneously displayed in first and second display areas, thereby providing a clear indication of the relationship between the specified data and the corresponding data. It is also possible that when the screen of one of the display areas is scrolled, the screen of the other display area is also scrolled in association therewith so that temporally corresponding data may always be displayed in both the display areas at predetermined positions respectively.

BRIEF DESCRIPTION OF THE DRAWINGS

FIG. 2A through 2D is a diagram showing, by way of example, the relationships of data, a clock, a qualifier and a sampling clock;

FIG. 3A is a diagram showing an example of a display of a state analysis on a display device in the conventional logic analzyer;

FIG. 3B is a diagram showing an example of a display of a timing analysis in the conventional logic analyzer;

FIG. 5 is a logic circuit diagram showing an operative specific example of a time difference measuring circuit 51 in FIG. 4;

FIG. 6A is a diagram illustrating a data memory 18;

FIG. 6B is a diagram illustrating an input interval memory 48;

FIG. 6C is a diagram illustrating a data memory 31;

FIG. 6D is a diagram illustrating an input interval memory 49;

DESCRIPTION OF THE PREFERRED EMBODIMENTS

Figure 1:
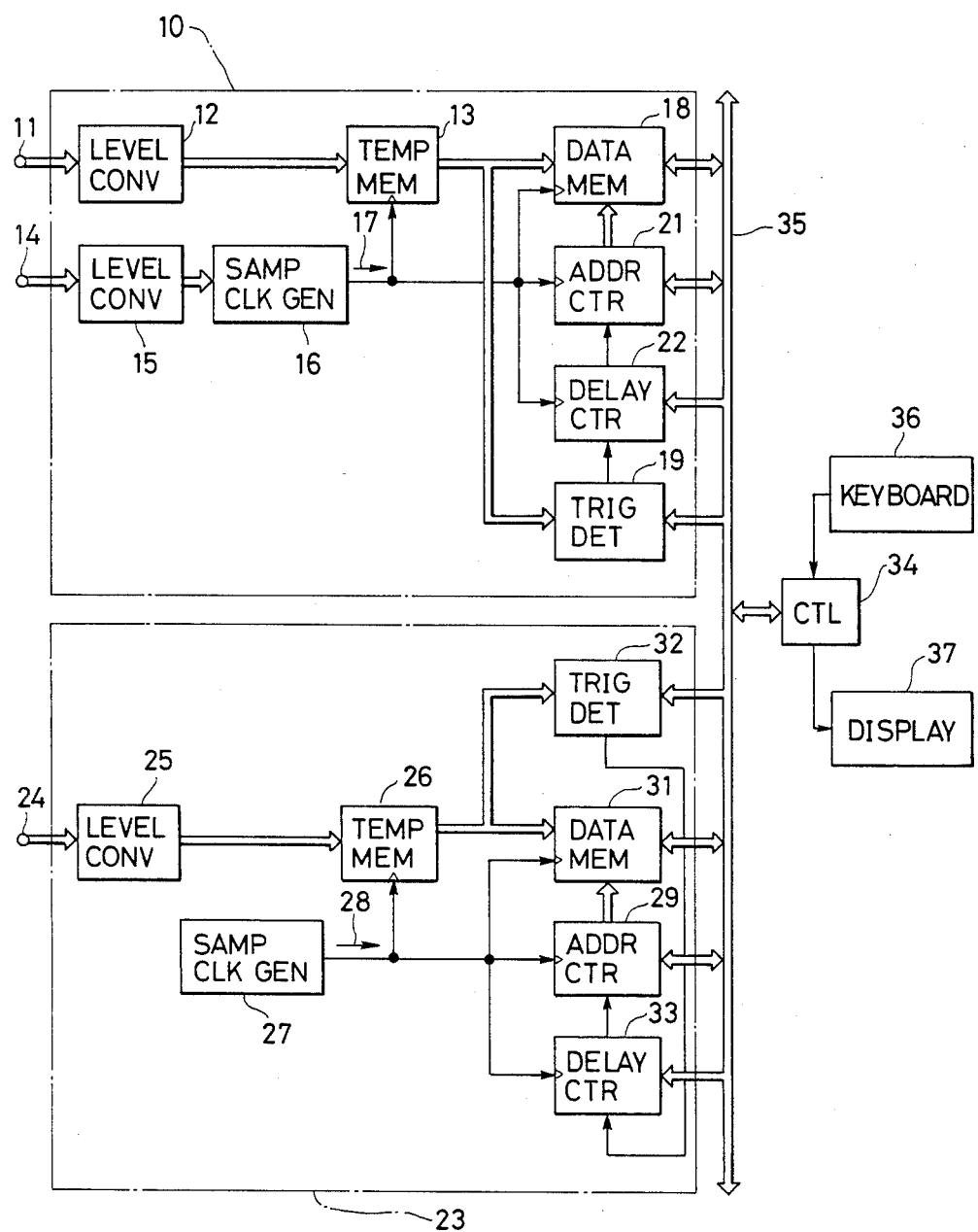
FIG. 1 is a block diagram illustrating a conventional logic analyzer.
Figure 4:
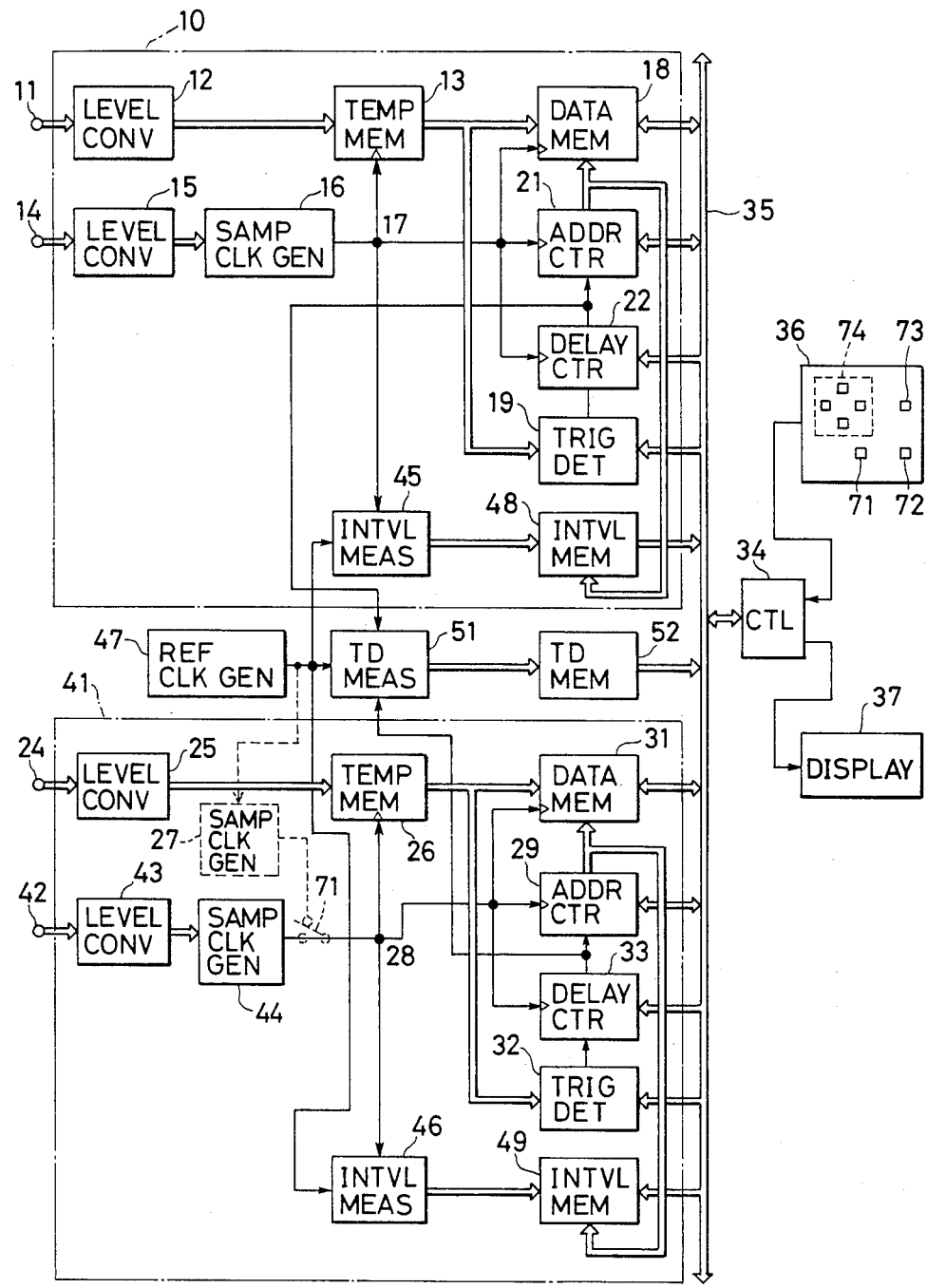
FIG. 4 is a clock diagram illustrating an embodiment of the present invention as being applied to a logic analyzer provided with two state analysis sections.

FIG. 4 illustrates an embodiment of the logic analyzer of the present invention, which is provided with two state analysis sections 10 and 41. In FIG. 4 the parts corresponding to those in FIG. 1 are identified by the same reference numerals. A second state analysis section 41 is supplied at the input port 24 with the second input data. A clock and a qualifier synchronized with the second input data are provided to an input port 42 and converted by a level converter 42 to logic levels, thereafter being applied to a sampling clock generator 44. The sampling clock generator 44 creates the sampling clock pulses 28 using the qualifier only when the second input data from the input port 24 changes, as is the case with the sampling clock generator 16 in the state analysis section 10. Accordingly, the second input data is stored in the temporary memory 26 only when the data changes.

In both of the state analysis sections 10 and 41 the successive loading intervals of the stored data are measured by loading interval measuring circuits 45 and 46, respectively. The thus measured loading intervals are the pulse intervals of the sampling clock pulses 17 and 28. For conducting the measurements, for instance, an interval measuring counter is used in each of the interval measuring circuits 45 and 46. Reference clock signals from a clock generator 47 are counted by the interval measuring counters in the interval measuring circuits 45 and 46, respectively. The interval measuring counters are reset by the sampling clock pulses 17 and 28, and their count values immediately before their resetting are output as the loading intervals. In this way, the loading intervals of the first and second input data are measured by the interval measuring circuits 45 and 46, respectively, and these measured loading intervals are stored in loading interval memories 48 and 49 using the count values of the address counters 21 and 29 as addresses therefor. That is to say, the input interval data thus stored in the input interval memories 48 and 49 have a one-to-one correspondence to the data stored in the data memories 18 and 31 at the same addresses as those in the memories 48 and 49.

Furthermore, the time difference between the time of stopping the writing in the data memories 18 and 31 is measured by applying the outputs of the delay counters 22 and 33 to a time difference measuring circuit 51. For example, the reference clock signal from the clock generator 47 is provided to the time difference measuring circuit 51 to measure the abovesaid time difference, and the measured time difference is stored in a time difference memory 52.

It is not predetermined which of the outputs from the delay counters 21 and 33 is applied earlier to the time difference measuring circuit 51. Therefore, the time difference measuring circuit 51 is arranged so that the measured time difference is accompanied by a signal indicating which of them was applied earlier. The time difference measuring circuit 51 has such a circuit arrangement as shown in FIG. 5, for instance. The outputs of the delay counters 22 and 33 are applied to input terminals 53 and 54, from which they are supplied to an exclusive OR circuit 55. The output of the exclusive OR circuit 55 is provided to set and reset terminals of an RS flip-flop 57 via AND circuits 56a and 56b, which are supplied with $\overline{Q}$ and Q outputs of the flip-flop 57, respectively. An earlier one of the inputs from the terminals 53 and 54 is provided via the exclusive OR circuit 55 and the AND circuit 56a to the flip-flop 57 (initially reset) to set it, and by its Q output, a gate 58 is enabled. The reference clock pulses from the reference clock generator 47 are applied via the gate 58 to a time counter 59 for counting. Further, the other of the inputs from the terminals 53 and 54 is supplied via the exclusive OR circuit 55 and the AND circuit 56b to the flip-flop 57, resetting it. In this way, the time difference between the two inputs, i.e. the time difference in occurrence between the outputs of the delay counters 22 and 23 is obtained as the count value of the time counter 59. Moreover, an RS flip-flop 61 is set by the input from the terminal 53, and is reset by the input from the terminal 54. The $\overline{Q}$ output of the flip-flop 61 is delivered, as a sign bit for the count value of the time counter 59, from a terminal 62. That is, when the input from the terminal 53 is earlier than the input from the terminal 54, the flip-flop 61 is set simultaneously with the starting of the counter 59 and then reset upon completion of the counting operation of the counter 59 and its $\overline{Q}$ output is derived as a high level at the terminal 62. Similarly, when the input from the terminal 54 is earlier than the input from the terminal 53, the $\overline{Q}$ output of the flip-flop 61 is provided as a low level upon completion of the counting of the counter 59. Incidentally, the inputs to the terminals 53 and 54 are selected short in duration so that they may not overlap each other in time.

With the arrangement illustrated in FIG. 4, when the address counter 21 is at the full count N−1, the data memory 18 holds the oldest data at its address 0 and the newest data at its last address N-1, as depicted in FIG. 6A. The loading intervals $\Delta t_{10}$ to $\Delta t_{1(N-1)}$ each between successive first input data loading time $t_{1(n-1)}$ and $t_{1n}$ at addresses n−1 and n of the data memory 18 are stored in the loading interval memory 48 at addresses 0 to N−1, respectively, as depicted in FIG. 6B, where n=1, 2, ... N. In this case, as shown in FIG. 6B, $\Delta t_{10}$ is stored in the loading interval memory 48 at the address 0, but this is an insignificant data.

In a similar manner, the second input data is stored in the data memory 31 at addresses 0 to M−1, as shown in FIG. 6C, and the loading intervals $\Delta t_{20}$ to $\Delta t_{2(M-1)}$ each between successive second input data loading time $t_{2(m-1)}$ and $t_{2m}$ where m=1, 2, . . . M are stored in the loading interval memory 49 at addresses 0 to M−1, respectively, as depicted in FIG. 6D, but $\Delta t_{20}$ stored in the input interval memory 49 at address 0 is insignificant. The contents of these loading interval memories, for example, $\Delta t_{1n}$ is the time interval between two adjacent sampling clock pulses for loading the first input data into the loading interval memory 48 at the addresses (n−1) and n, respectively.

Figure 7A:
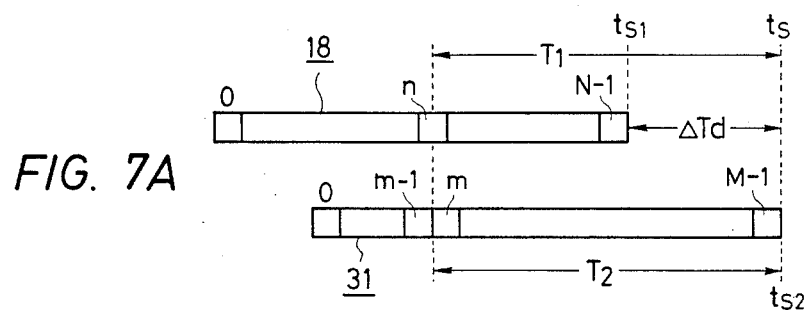
FIGS. 7A through 7D show, by way of example, various states of differences between input stop points of the data memories 18 and 31 and specified data.

Let it be assumed that data written last in the memories 18 and 31 (last data) are stored in their last addresses N−1 and M−1 respectively. FIG. 7A shows the stored contents of the data memories 18 and 31 along time axis so that the positions in an axial direction of those addresses 0, n, N−1, m−1, m and M−1 may roughly indicate the respective input data loading times at those addresses of the data memories 18 and 31. This example shows the case where the load-stop time $t_{s2}$ of the data memory 31 succeeds the load-stop time $t_{s1}$ of the data memory 18, and the time difference $\Delta Td$ between them is stored in the time difference memory 48.

Furthermore, according to the present invention, when a desired one of the data stored in one of the data memories 18 and 31 is specified by the keyboard (input means) 36, data stored in the other data memory is detected which was loaded at the time close to the time of loading of the specified data. For instance, when a cursor is positioned to specify a data on the display read out from the address n of the data memory 18 in FIG. 7A, data at the address m−1 (or m) of the data memory 31 is detected which was stored at a time close to that when the data at the address n of the data memory 18 was stored. FIG. 7A illustrates memory locations of the data memories 18 and 31 with their last addresses N−1 and M−1 held in correspondence to their write stopping points $t_{s1}$ and $t_{s2}$, respectively. The following procedure is used for obtaining data in the one of the data memories which was loaded at the closest time of loading of the specified data in the other data memory.

Figure 8:
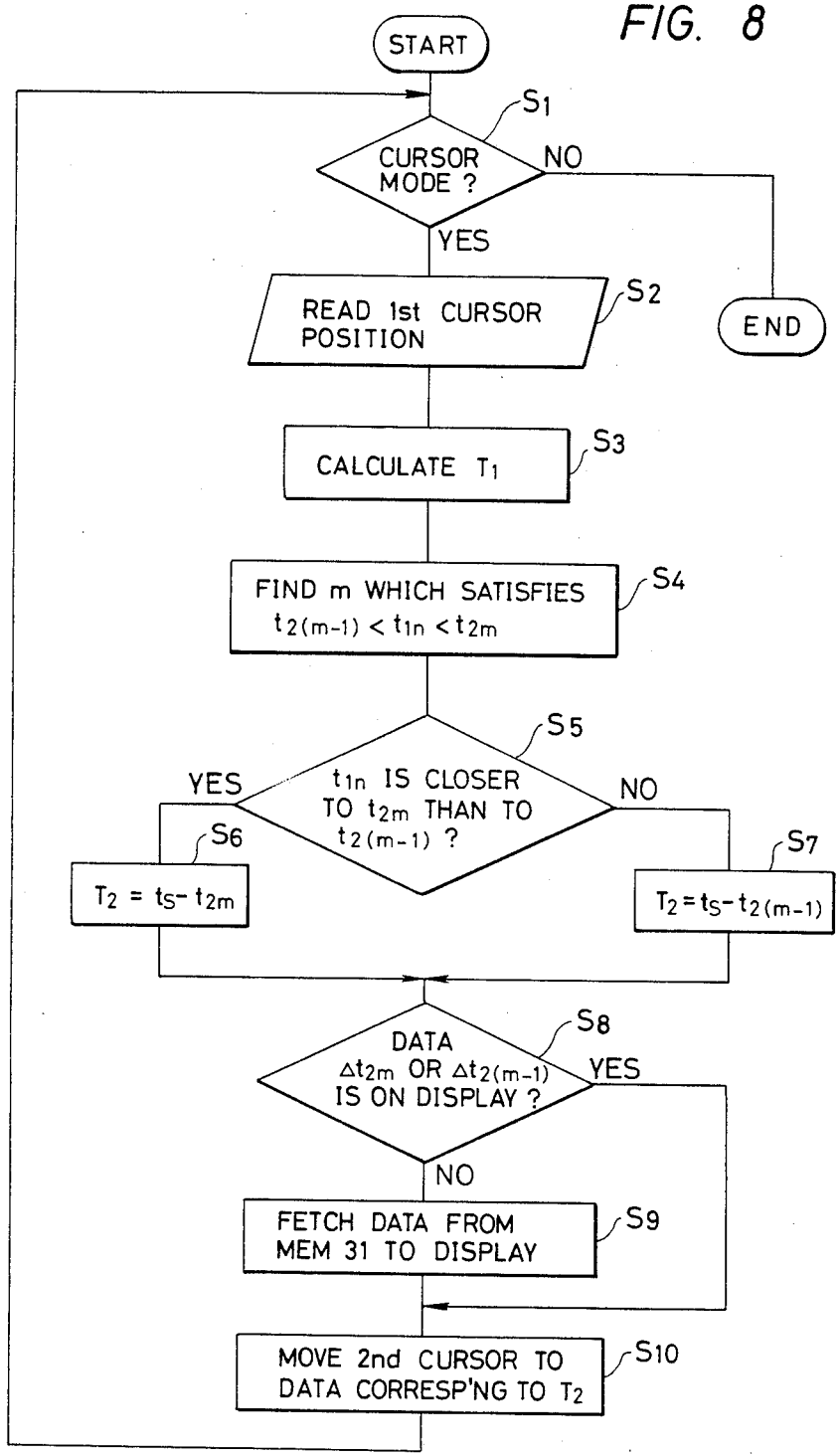
FIG. 8 is a flowchart showing an example of an operation for determining the position of a second cursor in accordance with the indication by a first cursor.

In the case of specifying data in the data memory 18 by means of a cursor, steps such as, for instance, shown in FIG. 8 are taken. In step $S_1$ a check is made to determine if the mode of operation is a concurrent cursor mode in which when the data in one of the data memories 18 and 31 is specified, data corresponding in loading time to the specified data is detected from the other data memory. If not, the process is immediately finished. If yes, however, the position of specifying the data in the data memory 18, i.e. the position of indication by a first cursor, entered through the keyboard 36, is read out in step $S_2$. In step $S_3$ the time difference between the later one of the data write stopping points $t_1$ and $t_2$ and the time of loading of the data at the position of the first cursor is obtained as a reference time interval $T_1$. When the time $t_{s2}$ is later than $t_{s1}$, as depicted in FIG. 7A, the reference time interval $T_1$ is obtained from the following expression (1):

$$T_1 = \sum_{i=n+1}^{N-1} \Delta t_{1i} + \Delta Td \qquad (1)$$

Figure 7B:
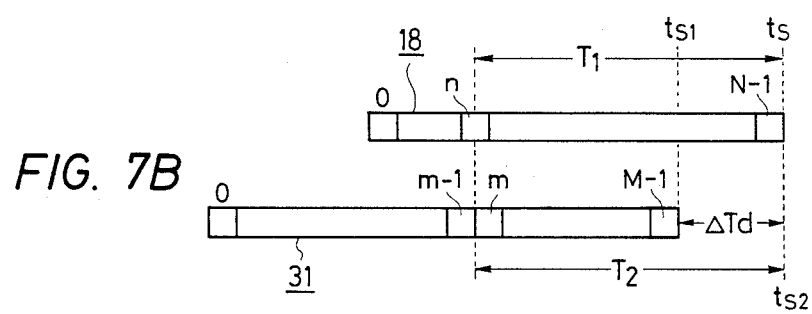

When the time $t_{s1}$ is later than $t_{s2}$, as shown in FIG. 7B, the reference time interval $T_1$ is obtained from the following expression (2):

$$T_1 = \sum_{i=n+1}^{N-1} \Delta t_{1i} \qquad (2)$$

The first term on the right side of the expression (1) and expression (2) are each the sum of successive data sampling intervals from the last data storing address N−1 to the address n of the data memory 18 specified by the first cursor, and this is obtained by adding together respective measured interval data from the address N−1 to the address n of the input interval memory 48.

In the next step $S_4$ a value m is obtained such that the input data loading time $t_{1n}$ at the address n may be intermediate between the input data loading time $t_{2m}$ and $t_{2(m-1)}$ of data at addresses m and m−1 of the data memory 31. That is to say, the value m is determined which provides those two values of the time interval between the sampling time of a data in the data memory 31 and the later one of the input data load stop points, which two values are immediately above and below the reference time interval $T_1$ respectively. In the case of FIG. 7A in which the input data load stop point $t_{s2}$ is later than the other stop point $t_{s1}$, the value m is obtained that satisfies the following expression (3):

$$\sum_{i=m+1}^{M-1} \Delta t_{2i} < T_1 < \sum_{i=m}^{M-1} \Delta t_{2i} \qquad (3)$$

The value of $\Delta t_{2i}$ are obtained successively from the interval memory 49. Namely, the measured time intervals $\Delta t_{2m}$ stored in the interval memory 49 are sequentially added starting with the one in the last address M−1, obtaining an address m−1 when the sum value exceeds $T_1$ and the immediately preceding address m. In the case of FIG. 7B in which the input data load stop point $t_{s1}$ is later than the other stop point $t_{s2}$, the value m is obtained that satisfies the following expression (4):

$$\sum_{i=m+1}^{M-1} \Delta t_{2i} + \Delta Td < T_1 < \sum_{i=m}^{M-1} \Delta t_{2i} + \Delta Td \qquad (4)$$

In the next step $S_5$ a check is made to determine if the data loading time $t_{2m}$ at the address m is closer to the data loading time $t_{1n}$ at the address n than the data loading time $t_{1(m-1)}$ at the address m−1 is. When the stop time $t_{s2}$ is later than the other stop time $t_{s1}$ (FIG. 7A), the following expression (5) is used as an expression for decision, and in the opposite case (FIG. 7B), the following expression (6) is used.

$$\left(T_1 - \sum_{i=m+1}^{M-1} \Delta t_{2i}\right) < \left(\sum_{i=m}^{M-1} \Delta t_{2i} - T_1\right) \qquad (5)$$

$$\left(T_1 - \sum_{i=m+1}^{M-1} \Delta t_{2i} - \Delta Td\right) < \left(\sum_{i=m}^{M-1} \Delta t_{2i} + \Delta Td - T_1\right) \qquad (6)$$

When the expression (5) or (6) is satisfied, if the data loading time $t_{2m}$ at the address m is closer to the data loading time $t_{1n}$ at the address n than the data loading time $t_{2(m-1)}$ at the address m−1 is, then the time difference between the data loading time $t_{2m}$ at the address m and the later data load stop time $t_s$ is set as $T_2$ in step $S_6$. When the expression (5) or (6) is not satisfied, the time difference between the input data loading time $t_{2(m-1)}$ at the address m−1 and the later stop point $t_s$ is set as $T_2$ in step $S_7$.

In step $S_6$ the computation of the following expression (7) or (8) is conducted depending upon whether the input stop point $t_{s2}$ is later or earlier than the other stop point $t_{s1}$:

$$T_2 = \sum_{i=m+1}^{M-1} \Delta t_{2i} \tag{7}$$

$$T_2 = \sum_{i=m+1}^{M-1} \Delta t_{2i} + \Delta Td \tag{8}$$

In step $S_7$ the following expression (9) or (10) is computed depending upon whether the input stop point $t_{s2}$ is later or earlier than the other stop point $t_{s1}$:

$$T_2 = \sum_{i=m}^{M-1} \Delta t_{2i} \tag{9}$$

$$T_2 = \sum_{i=m}^{M-1} \Delta t_{2i} + \Delta Td \tag{10}$$

Thus it is possible to specify the address m or m−1 of the data memory 31 at which data was stored at a time close to that for the data at the address n of the data memory 18. In other words, the data in the data memory 31 can be obtained which corresponds in time to the data in the data memory 18 specified by the first cursor. In step $S_8$ it is checked whether or not the data at the address m or m−1 of the data memory 31 is being displayed on the display screen of the display device. Usually the display device 37 does not display all the data of either data memory 18 or 31, but displays only those portions of the data before and after the trigger marker. Accordingly, the data in the data memory 31 corresponding to the data specified by the first cursor is not always displayed on the display screen of the display device 37. Then, in the event that the data in the data memory 31 corresponding to the time interval $T_2$ is not being displayed on the display device 37, the data is input into the display device 37 from the data memory 31 in step $S_9$ so that the data corresponding to the time interval $T_1$ may be displayed on the display device 37. When the data corresponding to the time interval $T_1$ is displayed on the display device 37 from the beginning, the process proceeds from step $S_8$ directly to step $S_{10}$. In step $S_{10}$ a second cursor is moved to the position of the data corresponding to the time interval $T_2$ on the display screen, that is, to the position of the data read out from the address m or m−1 in the data memory 31, after which the process returns to step $S_1$.

Figure 9A:
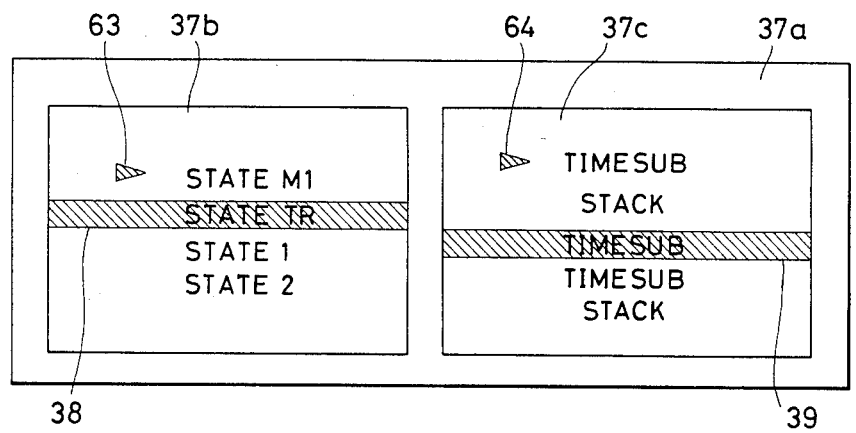
FIGS. 9A through 9D are diagrams showing examples of various displays in the logic analyzer of the present invention.

The data of the data memories 18 and 31 may also be displayed alternately on one display screen, as referred to previously in connection with FIG. 3. Alternatively, as depicted in FIG. 9A, a relatively wide display screen is used as the display screen 37a of the display device 37 and the display screen 37a is divided into left and right display areas 37b and 37c, on which the data of the data memories 18 and 31 are displayed and the trigger data set by the trigger detectors 19 and 32 are indicated by the trigger markers 38 and 39, respectively. At the same time, the specified data in the data memory 18 is indicated by the first cursor 63 in the display area 47c and the data at the address m or m−1 of the data memory 31, corresponding to the time interval $T_2$ is similarly indicated by the second cursor 64 in the display area 37d. Thus the cursors 63 and 64 immediately provide a clear indication of the temporal relationship between different data delivered from the input ports 11 and 24.

Figure 10:
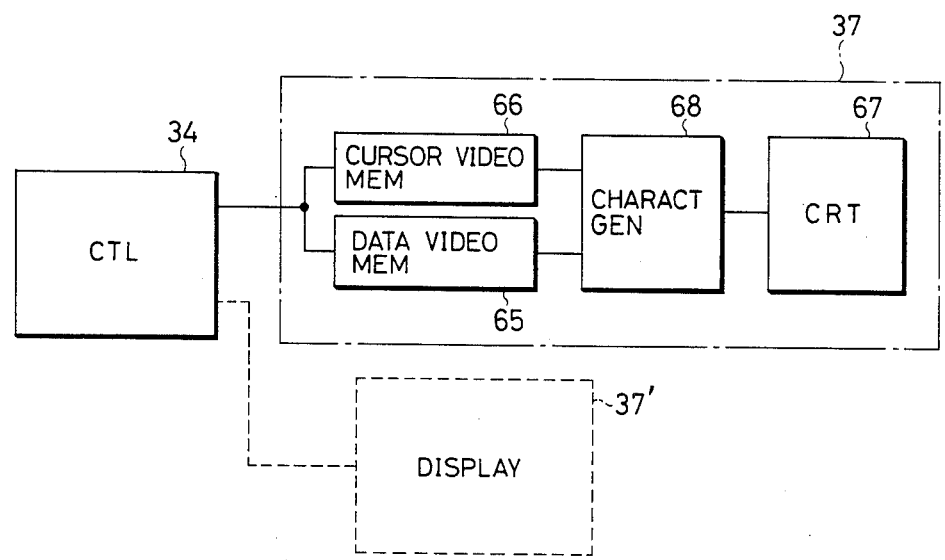
FIG. 10 is a block diagram illustrating a specific operative example of a display device 37.

In the display device 37 the data input from the controller 34 is stored, for example, in a data video memory 65, as shown in FIG. 10. In the state analysis, data representing character and/or symbols to be displayed at respective parts in the display areas 37b and 37c are stored in the video memory 65 at addresses corresponding to the display positions in the display area. Likewise data representing the trigger markers 38 and 39 and the cursors 63 and 64 are stored in a cursor video memory 66 at addresses corresponding to the display positions in the display area. The video memories 65 and 66 are read out in synchronism with the scanning of the display screen of a cathode ray tube display (a so-called CRT display) 67, and their outputs are provided to a code pattern converter 68 (a so-called character generator), wherein the data such as a character or symbol is converted to dot data for input as display data into the display 67.

Figure 7C:
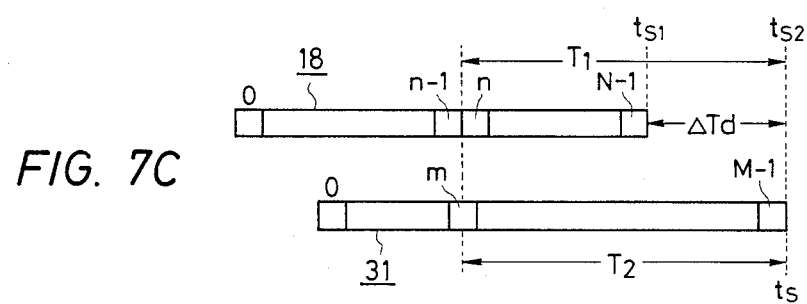
Figure 7D:
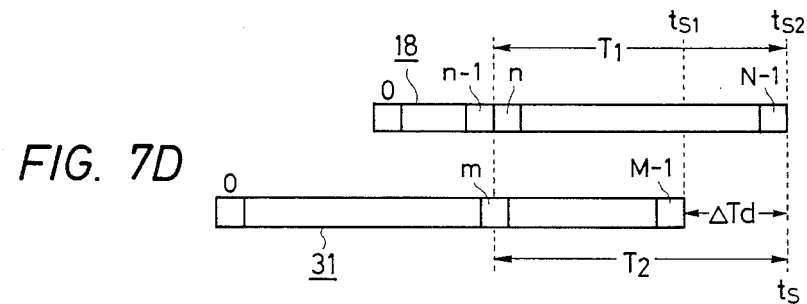
Figure 11:
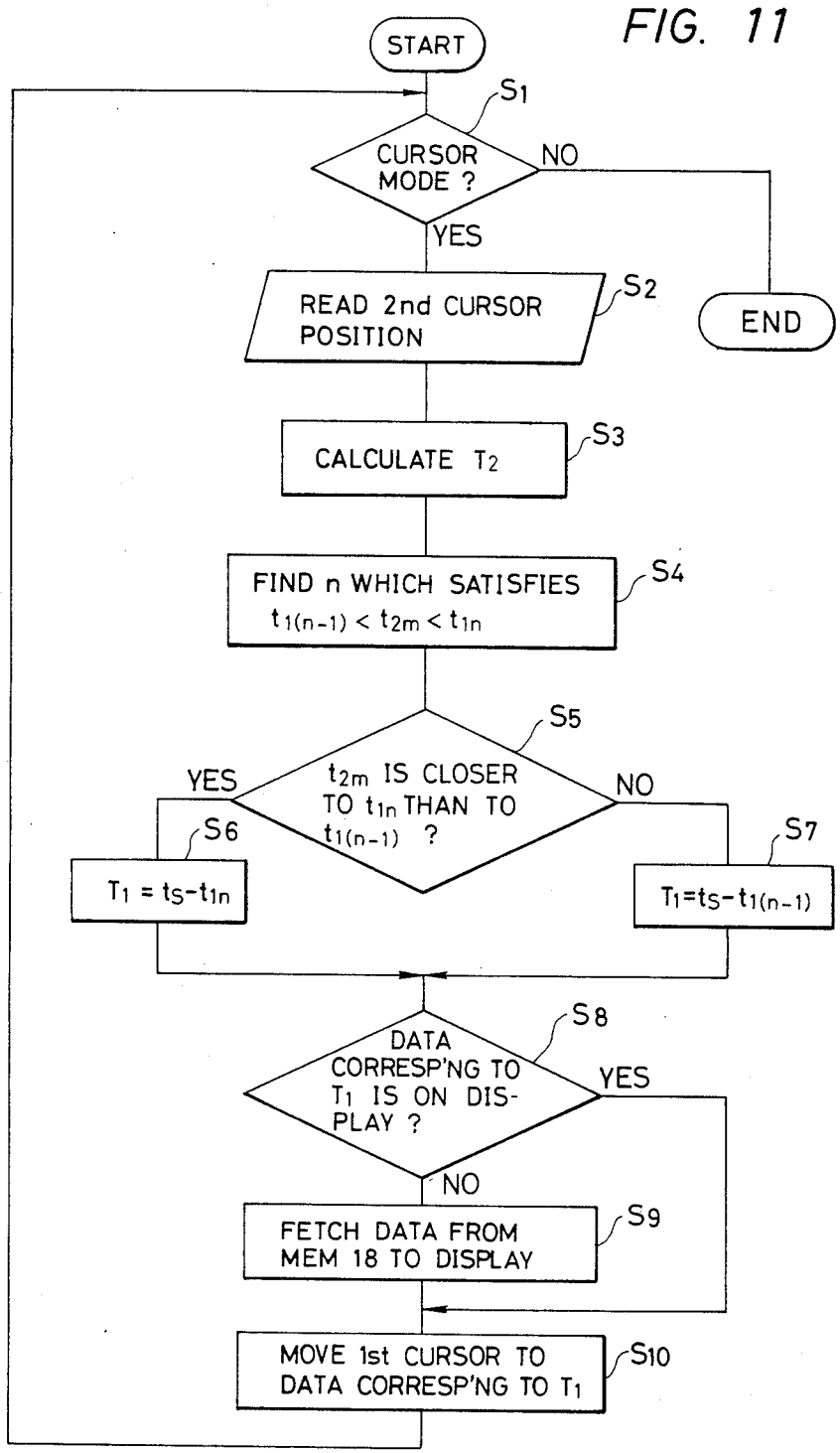
FIG. 11 is a flowchart showing an example of an operation for determining the position of the first cursor in accordance with the indication of the second cursor.

In the above the data in the data memory 18 is specified first. On the other hand, in the case of specifying the data at the address m of the data memory 31 by the second cursor 64 and then the data in the data memory 18 loaded thereinto at a point of time close to the time of loading of the specified data, such steps as shown in FIG. 11 are taken. In step $S_1$ a check is made to determine if the mode of operation is the concurrent cursor mode, and if so, the address m in the data memory 31 specified by the second cursor 46 is read out in step $S_2$. In step $S_3$ a time difference between the later one of the input data load stop points $t_{s1}$ and $t_{s2}$ and the input data loading time $t_{2m}$ at the specified address m is obtained as the reference time interval $T_2$. This operation is conducted using the following expression (11) or (12) in dependence upon whether the input data load stop point $t_{s2}$ is later (FIG. 7C) or earlier (FIG. 7D) than the other stop point $t_{s1}$:

$$T_2 = \sum_{i=m+1}^{M-1} \Delta t_{2i} \tag{11}$$

$$T_2 = \sum_{i=m+1}^{M-1} \Delta t_{2i} + \Delta Td \tag{12}$$

In step $S_4$ such a value n is determined that satisfies $t_{1(n-1)} < t_{2m} < t_{1n}$, that is, the reference time interval $T_2$ may be between the two time intervals from the reference point $t_s$ (i.e. later one of the stop points $t_{s1}$ and $t_{s2}$) to the respective input data loading points $t_{1n}$ and $t_{1(n-1)}$ at the addresses n and n−1. That is to say, the value n is obtained which satisfies the following expression (13) or (14) depending on whether the input data load stop point $t_{s2}$ is later or earlier than the other stop point $t_{si}$:

$$\sum_{i=n+1}^{N-1} \Delta t_{1i} + \Delta Td < T_2 < \sum_{i=n}^{N-1} \Delta t_{1i} + \Delta Td \tag{13}$$

$$\sum_{i=n+1}^{N-1} \Delta t_{1i} < T_2 < \sum_{i=n}^{N-1} \Delta t_{1i} \tag{14}$$

In step $S_5$ it is checked whether or not the data loading time $t_{1(n-1)}$ at the address n−1 is closer to the data loading time $t_{2m}$ at the address m than the data loading time $t_{1n}$ at the address n is close to. That is, it is checked whether the following expression (15) holds when the input data load stop point $t_{s2}$ is later than the other stop point $t_{s1}$, and whether the following expression (16) holds when the input data load stop point $t_{s1}$ is later than the other stop point $t_{s2}$:

$$\left(T_2 - \sum_{i=n+1}^{N-1} \Delta t_{1i} - \Delta Td\right) < \left(\sum_{i=n}^{N-1} \Delta t_{1i} + \Delta Td - T_2\right) \quad (15)$$

$$\left(T_2 - \sum_{i=n+1}^{N-1} \Delta t_{1i}\right) < \left(\sum_{i=n}^{N-1} \Delta t_{1i} - T_2\right) \quad (16)$$

When the data loading time $t_{1n}$ at the address n is closer to the data loading time $t_{2m}$ at the address m, the difference between the reference time $t_s$ and the data loading time $t_{1n}$ at the address n is set as $T_1$ in step $S_6$. This operation is conducted using the following expression (17) or (18) depending upon whether the data load stop point $t_{s2}$ is later or earlier than the other stop point $t_{s1}$:

$$T_1 = \sum_{i=n+1}^{N-1} \Delta t_{1i} + \Delta Td \quad (17)$$

$$T_1 = \sum_{i=n+1}^{N-1} \Delta t_{1i} \quad (18)$$

Where it is decided in step $S_5$ that the data loading time $t_{1(n-1)}$ at the address n−1 is closer to the data loading time $t_{2m}$ at the address m, the difference between the data loading time $t_{1(n-1)}$ at the address n−1 and the reference time $t_s$ is used as $T_1$ in step 7. This operation is conducted using the following expression (19) or (20) depending upon whether the data load stop point $t_{s2}$ is later or earlier than the other stop point $t_{s1}$:

$$T_1 = \sum_{i=n}^{N-1} \Delta t_{1i} + \Delta Td \quad (19)$$

$$T_1 = \sum_{i=n}^{N-1} \Delta t_{1i} \quad (20)$$

In step $S_8$ it is checked whether or not data corresponding to $T_1$ is being displayed on the display screen. If not, the corresponding data is input from the data memory 18 into the display device in step $S_9$ and, in step $S_{10}$, the first cursor 63 is positioned at the data corresponding to the time $T_1$. Incidentally, the operation shown in FIG. 8 or 11 is initiated after deciding whether the first cursor indication is provided for the data of the data memory 18 or 31.

Figure 9B:
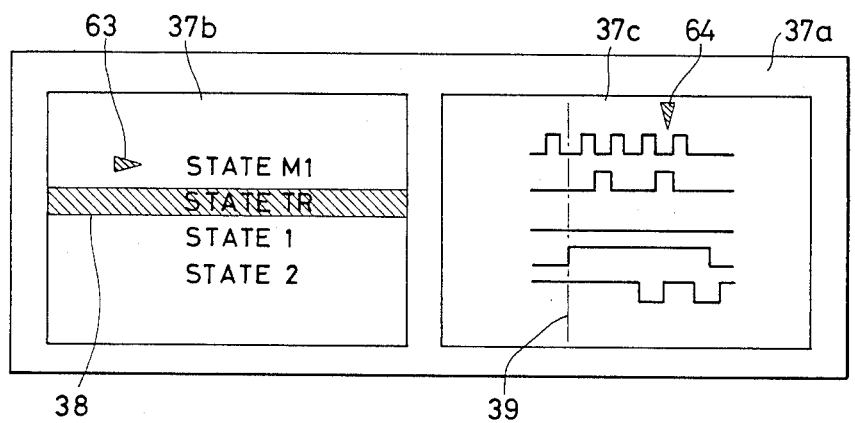
Figure 9C:
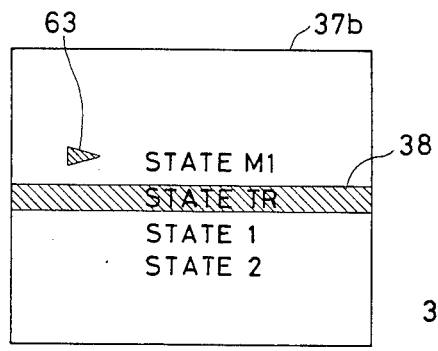
Figure 9D:
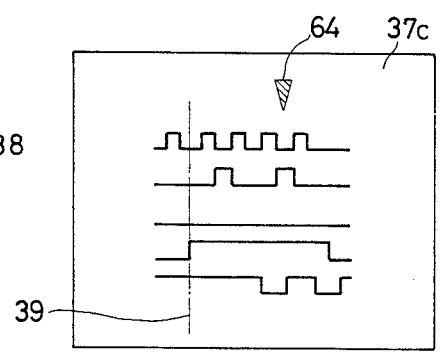
Figure 12:
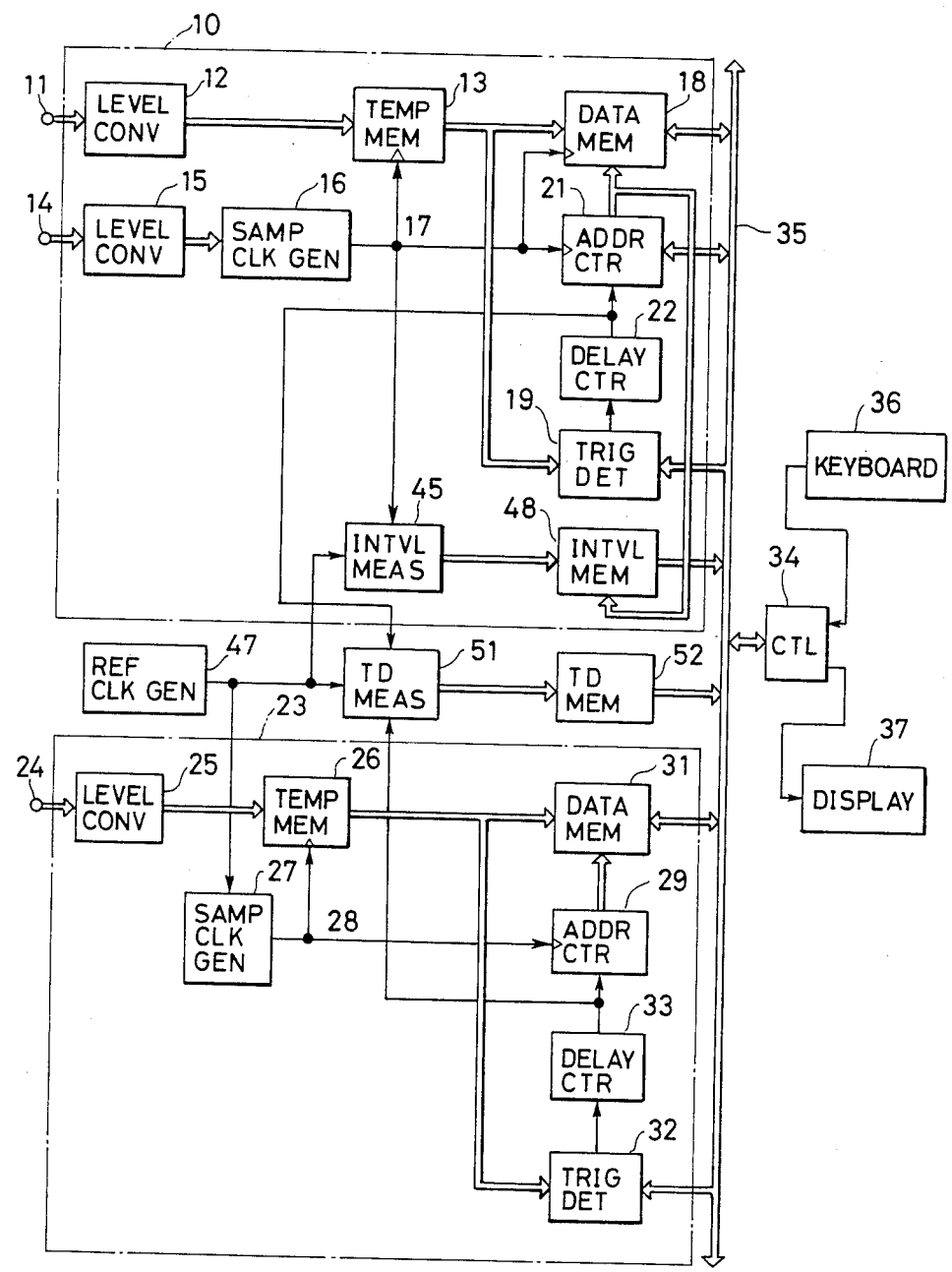
FIG. 12 is a block diagram illustrating another embodiment of the present invention as being applied to a logic analyzer which is provided with a state analysis section and a timing analysis section.

While in FIG. 4 the state analysis sections 10 and 41 are provided, the present invention is applicable as well to the case of employing the state analysis section 10 and the timing analysis section 23, as shown in FIG. 12 in which the parts corresponding to those in FIGS. 4 and 1 are identified by the same reference numerals. In this example the level converter 43, the sampling clock generator 44, the interval measuring circuit 46 and the interval memory 49 in FIG. 4 are omitted but the sampling clock generator 27 is employed as in the case of FIG. 1. In this case, the frequency of the sampling clock 28 is variable and the sampling clock 28 is obtained using the reference clock signal from the clock generator 47 as a reference. Data for displaying such state analysis data as shown in FIG. 3A is stored in the data memory 18 and data for displaying such timing analysis data as shown in FIG. 3B is stored in the data memory 31. Also in this instance, the state analysis data is displayed in the display area 37b of the display screen 37a with the time axis held in the vertical direction and the timing analysis data in the display area 37c with the time axis in the horizontal direction, as depicted in FIG. 9B. In the display area 37b the trigger marker 38 is displayed as a horizontal line and the first cursor 63 is also displayed sideways, whereas in the display area 37c the trigger marker 39 is displayed as a vertical line and the second cursor 64 is also displayed pointing downward.

This embodiment also involves the computation of $\Sigma \Delta t_{2i}$ in the operation for obtaining the corresponding data as in the foregoing embodiments. Since the period of the sampling clock 28 (the data input period of the input port 24) is a constant value $\Delta t_2$, however, $\Delta t_{2i}$ in the processes shown in FIGS. 8 and 11 assumes the constant value $\Delta t_2$. Accordingly, it is necessary only to obtain the address m or m−1, or n or n−1 through use of the constant $\Delta t_{2i}$ following the procedure depicted in FIG. 8 or 11. Moreover, since $\Delta t_{2i}$ is fixed, the interval measuring circuit 46 and the input interval memory 49 can be left out.

In the case of specifying data in the data memory 18 by the first cursor 63 and data of the corresponding data loading time in the data memory 31 by the second cursor 64 in the embodiment of FIG. 12, the process proceeds following the procedure shown in FIG. 8. Operation expressions in relevant steps will hereinbelow be given. In step $S_3$ the following expression (21) or (22) is used depending upon whether the input data load stop point $t_{s2}$ is later (FIG. 7A) or earlier (FIG. 7B) than the other stop point $t_{s1}$:

$$T_1 = \sum_{i=n+1}^{N-1} \Delta t_{1i} + \Delta Td \quad (21)$$

$$T_1 = \sum_{i=n+1}^{N-1} \Delta t_{1i} \quad (22)$$

In step $S_4$ the following expression (23) or (24) is used depending upon whether the input data load stop point $t_{s2}$ is later or earlier than the other stop point $t_{s1}$:

$$\{M-(m+1)\}\cdot\Delta t_2 < T_1 < (M-m)\cdot\Delta t_2 \quad (23)$$

$$\{M-(m+1)\}\cdot\Delta t_2 + \Delta Td < T_1 < (M-m)\cdot\Delta t_2 + \Delta Td \quad (24)$$

In step $S_5$ the following expression (25) or (26) is used depending upon whether the input data load stop point $t_{s2}$ is later or earlier than the other stop point $t_{s1}$:

$$[T_1-\{M-(m+1)\}\cdot\Delta t_2] < [(M-m)\cdot\Delta t_2 - T_1] \quad (25)$$

$$[T_1-\{M-(m+1)\}\cdot\Delta t_2 - \Delta Td] < [(M-m)\cdot\Delta t_2 + \Delta Td - T_1] \quad (26)$$

In step $S_6$ the following expression (27) or (28) is used depending upon whether the input data load stop point $t_{s2}$ is later or earlier than the other stop point $t_{s1}$:

$$T_2 = \{M-(m+1)\}\cdot\Delta t_2 \quad (27)$$

$$T_2 = \{M-(m+1)\}\cdot\Delta t_2 + \Delta Td \quad (28)$$

In step $S_7$ the following expression (29) or (30) is used depending upon whether the input data load stop point $t_{s2}$ is later or earlier than the other stop point $t_{s1}$:

$$T_2 = (M-m)\cdot\Delta t_2 \quad (29)$$

$$T_2 = (M-m)\cdot \Delta t_2 + \Delta Td \quad (30)$$

In the case of specifying data in the timing analysis section 23 by the cursor 64 and the corresponding data in the state analysis section 10 by the cursor 63, the steps shown in FIG. 11 are taken, and the operation expressions in relevant steps are as follows: In step $S_3$ the following expression (31) or (32) is used depending upon whether the input data load stop point $t_{s2}$ is later or earlier than the other stop point $t_{s1}$:

$$T_2 = \{M-(m+1)\}\cdot \Delta t_2 \quad (31)$$

$$T_2 = \{M-(m+1)\}\cdot \Delta t_2 + \Delta Td \quad (32)$$

In step $S_4$ the following expression (33) or (34) is used depending upon whether the input data load stop point $t_{s2}$ is later or earlier than the other stop point $t_{s1}$:

$$\sum_{i=n+1}^{N-1} \Delta t_{1i} + \Delta Td < T_2 < \sum_{i=n}^{N-1} \Delta t_{1i} + \Delta Td \quad (33)$$

$$\sum_{i=n+1}^{N-1} \Delta t_{1i} < T_2 < \sum_{i=n}^{N-1} \Delta t_{1i} \quad (34)$$

In step $S_5$ the following expression (35) or (36) is used depending upon whether the input data load stop point $t_{s2}$ is later or earlier than the other stop point $t_{s1}$:

$$\left(T_2 - \sum_{i=n+1}^{N-1} \Delta t_{1i} - \Delta Td\right) < \left(\sum_{i=n}^{N-1} \Delta t_{1i} + \Delta Td - T_2\right) \quad (35)$$

$$\left(T_2 - \sum_{i=n+1}^{N-1} \Delta t_{1i}\right) < \left(\sum_{i=n}^{N-1} \Delta t_{1i} - T_2\right) \quad (36)$$

In step $S_6$ the following expression (37) or (38) is used depending upon whether the input data load stop point $t_{s2}$ is later or earlier than the other stop point $t_{s1}$:

$$T_1 = \sum_{i=n+1}^{N-1} \Delta t_{1i} + \Delta Td \quad (37)$$

$$T_1 = \sum_{i=n+1}^{N-1} \Delta t_{1i} \quad (38)$$

In step $S_7$ the following expression (39) or (40) is used depending upon whether the input data load stop point $t_{s2}$ is later or earlier than the other stop point $t_{s1}$:

$$T_1 = \sum_{i=n}^{N-1} \Delta t_{1i} + \Delta Td \quad (39)$$

$$T_1 = \sum_{i=n}^{N-1} \Delta t_{1i} \quad (40)$$

As described above, in the case of specifying data stored in one of the data memories 18 and 31 and data input into the other data memory at a time close to that of the specified data, it is necessary only to find out the corresponding data in the other data memory so that the time difference between the loading time of the corresponding data and the reference time $t_s$ is the closest to the reference time interval which is the time difference between the loading time of the first-specified data and the reference time $t_s$. While in the above the later one of the input data load stop points $t_{s1}$ and $t_{s2}$ is used as the reference time $t_s$, it is also possible to use the input data load stop point of the data memory which has stored therein the first-specified data. That is, the time $t_{s1}$ may be used as the reference time $t_s$ in both cases of FIGS. 7A and 7B. In consequence, the reference time interval $T_s$ is given as follows:

$$T_s = \sum_{i=n+1}^{N-1} \Delta t_{1i} \quad (41)$$

Then the address m is determined so that the value of the following expression may become close to the above calculated $T_s$:

$$\sum_{i=m}^{M-1} \Delta t_{2i} + \Delta Td \quad (42)$$

In this case, $\Delta Td$ is a value including its sign. When the data load stop point $t_{s2}$ is later than the other stop point $t_{s1}$ (FIG. 7A), a sign bit at a terminal 62 in FIG. 5 goes to "1", in which case the absolute value of $\Delta Td$ is subtracted in the expression (42). When the data load stop point $t_{s1}$ is later than the other stop point $t_{s2}$ (FIG. 7B), the sign bit at the terminal 62 goes to "0", in which case the absolute value of $\Delta Td$ is added in the expression (42). Also in the cases of FIGS. 7C and 7D, by setting the data load stop point $t_{s2}$ of the data memory 31 as the reference time $t_s$, the data corresponding to the specified data in the data memory 18 can similarly be indicated using, as the reference time interval, the difference between the reference time $t_s$ and the specified data loading time.

Figure 13:
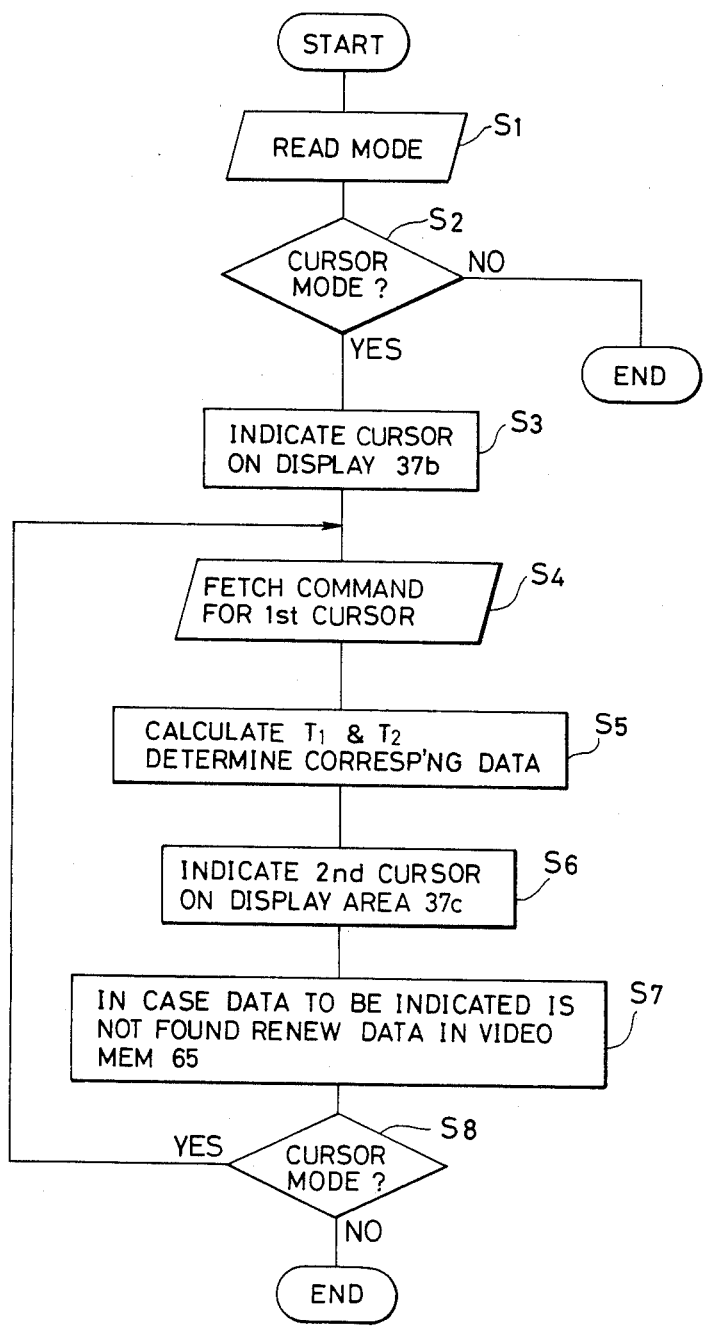
FIG. 13 is a flowchart showing an example of an operation for moving one of the cursors in association with the operation of the other cursor.

Although in the above the data stored in one of the data memories 18 and 31 is specified by a cursor, it is not always necessary to perform an operation by which the data is specified, for instance from an external computer. Thus, the corresponding data, i.e. data corresponding to the time $T_2$ in FIG. 8 (data corresponding to the time $T_1$ in FIG. 11) can be delivered to the outside while the data corresponding to the time $T_2$ (or $T_1$) is specified by the cursor. It is also possible to operatively associate the cursors for the two analysis sections with each other so that they always indicate data stored at the closest points of time. To perform this, such a process as shown in FIG. 13 is conducted. In step $S_1$, the operator's input mode is read out and it is checked in step $S_2$ whether the input mode is the concurrent cursor mode. If so, then the first cursor 63 is displayed on the display area 37b (FIG. 9B) in step $S_3$. This display is provided at a position set in the previous cycle of operation, or at a predetermined initial position. In step $S_4$ an external command, for instance, a move command for the first cursor 63 by the operation of the keyboard 36, is read. In step $S_5$ $T_1$ is computed relative to the commanded position of the first cursor 63, as described previously with respect to FIG. 8, and then $T_2$ is calculated, determining the corresponding data to be displayed in the display area 37c. In step $S_6$ the corresponding data in the display area 37c is indicated by the second cursor 64. When the data to be indicated by the second cursor 64 is not on display in the display area 37c, data in the video memory 65 (in FIG. 10) for the data memory 31 is updated in step $S_7$ so that the data to be indicated by the second cursor 64 is displayed. In step $S_8$ it is checked whether the concurrent cursor mode is still retained, and if so, the process returns to step $S_3$.

Figure 14:
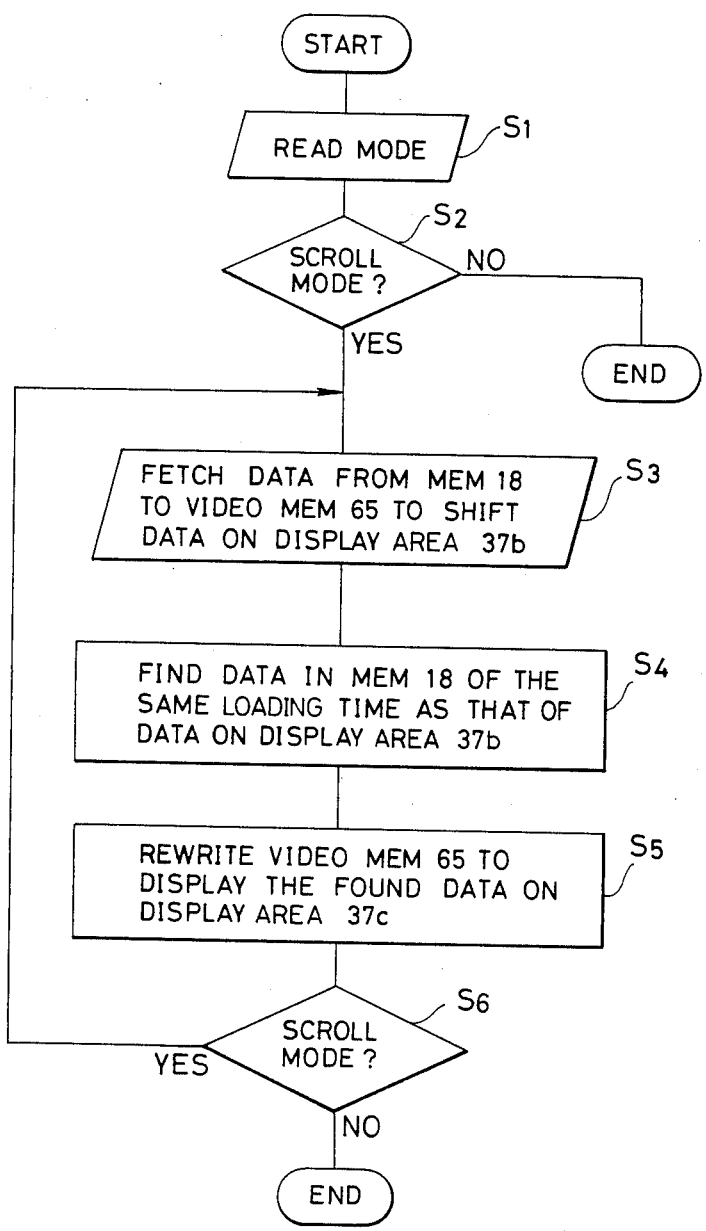
FIG. 14 is a flowchart showing an example of an operation for scrolling the screen of one of the display areas in association with scrolling of the screen of the other display area.

There are cases of employing what is called a scroll mode in which data in the data memory 18 or 31 is manually or automatically delivered one by one to the display device 37 to sequentially scroll the data on its display screen. In the case of providing displays on the two display areas 37b and 37c as depicted in FIG. 9B, it would be convenient if provision would be made so that when one of the display areas 37b and 37c is put into the scroll mode, the other also automatically enters the scroll mode, thus displaying temporally-corresponding data in the both display areas at all times. This can be accomplished by performing such a process as shown in FIG. 14. In step $S_1$ the operator's set mode of operation is read and it is checked in step $S_2$ whether it is a concurrent scroll mode. In the case of the concurrent scroll mode, when the operator performs an operation for scrolling data in the display area 37b, data in the data memory 18 is sequentially transferred to the video memory 65 in response to the operation, scrolling the data in the display area 37b. In step $S_4$ a search is made in the data memory 31 for data of the same loading time as that of the data being scrolled on the display area 37b. This operation is carried out in the same manner as described previously with regard to FIG. 8 (or FIG. 11). In such a case, for example, the data (the address) at the center of the display area 37b in the time-axis direction is processed as the address n specified by the first cursor 63. In this way, the data corresponding in time to the data at the reference position in the display area 37b is found in the data memory 31. In step $S_5$ the corresponding area of the video memory 65 is updated so that the data may be displayed in the display area 37c. In step $S_6$ it is checked whether the concurrent scroll mode is still retained, and if so, the process returns to step $S_3$.

As illustrated in FIG. 4, the keyboard 36 has mounted thereon a key 71 for selecting the concurrent cursor mode, a key 72 for selecting the concurrent scroll mode, a data/cursor switching key 73 and a key 74 for moving the data or cursor on the display screen 37a in the horizontal or vertical direction. The keyboard 36 further includes a ten-key pad for setting trigger data and a delay time, as referred to previously, and other function keys. As the time difference memory 52, a memory in the controller 34 may also be employed.

In the above the display screen 37a need not always be divided into the display areas 47b and 47c but it is also possible to connect a display device 37' to the controller 34, as shown in FIG. 10, so that the contents of the data memories 18 and 31 are displayed on the display screens of the display devices 37 and 37'.

Provision may also be made for indicating the correspondence of data specified by both the cursors 63 and 64 in the scroll mode as well as for displaying corresponding data at the same predetermined positions, for example, at the central positions in the display areas 37b and 37c. In either of the scroll and the concurrent cursor mode, the present invention is applicable not only to the simultaneous display of state analysis data and timing analysis data but also the simultaneous display of data when the two analysis sections are both for state analysis. Moreover, the present invention is applicable not only to the case where data of one of the data memories 18 and 31 is specified and the data in the other data memory corresponding in time to the specified data is displayed, but also to the case where data in one of the two data memories is specified, for example, by an external electronic computer and the temporally corresponding data is delivered from the other data memory.

In FIGS. 8 and 11, it is also possible to omit step $S_5$ and perform only step $S_6$ (or $S_7$) at all times. Furthermore, it is possible to provide three or more analysis sections and utilize the concurrent cursor mode or concurrent scroll mode in displaying their data.

Also it is possible to supply the output reference clock of the reference clock generator 47 to a sampling clock generator 27 and selectively change over the sampling clock generators 27 and 44 by a switch 71 to provide the sampling clock 28, as indicated by the broken lines in the state analysis section 41 depicted in FIG. 4. With such an arrangement, when the analysis section 41 makes a timing analysis using the sampling clock generator 27, a fixed value is always stored in the input interval memory 49 but the process can be performed using the same program as that for the process in the state analysis.

Figure 15:
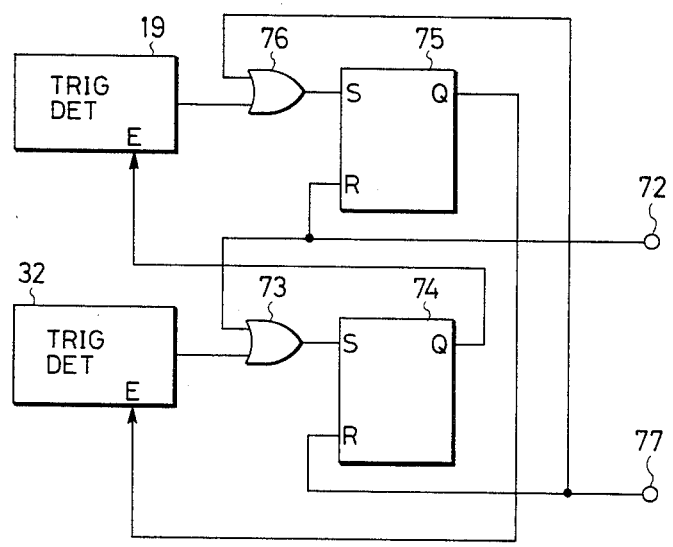
FIG. 15 is a block diagram illustrating an example of a trigger priority means.

Sometimes a trigger priority means is provided so that after a specified one of the trigger detectors yields the detected output, the other trigger detector is allowed to operate. For example, as shown in FIG. 15, when a first trigger priority command is applied to a terminal 72, the command sets a flip-flop 74 via an OR circuit 73 to make the Q output of the flip-flop 74 high-level and the high-level output is provided to an enable terminal E of the trigger word detector 19, putting it in operation. The first trigger priority command at the terminal 72 is provided as well to a reset terminal R of a flip-flop 75 to reset it to make its Q output low-level, and this low-level output is applied to an enable terminal E of the trigger detector 32, putting it out of operation. In this state, even if the trigger detector 32 is supplied with the same data as its set data, it will not create its detected output. When the trigger detector 19 is supplied with the same data as its set data, it yields the detected output, which is applied via an OR circuit 76 to the flip-flop 75 to set it. In consequence, the trigger detector 32 enters its operative state. Thus the trigger detector 32 performs the trigger detecting operation after the trigger detector 19 detect a trigger data. A second trigger priority command, which is provided to a terminal 77, resets the flip-flop 74 and sets the flip-flop 75 via the OR circuit 76. Accordingly, the trigger detector 32 is made operative but the trigger detector 19 inoperative. In this state, when the trigger detector 32 produces its detected output, it is provided via the OR circuit 73 to the set terminal of the flip-flop 74.

As has been described in the foregoing, according to the present invention, when desired data in one of the data memories of a plurality of analysis sections is specified, temporally corresponding data in the other data memory is automatically specified, so that the temporal correspondence between data of the plurality of analysis sections can easily be discerned, greatly facilitating the analysis. Especially, the temporal correspondence between data indicating each step of a program, i.e. a display of a state analysis and signal waveforms, i.e. a display of a timing analysis can easily be recognized. This permits accurate and easy analysis of a logic circuit.

Besides, the states of the plurality of analysis sections are simultaneously displayed, and when the cursor in one of display areas is moved to a desired position, the cursor in the other display area is automatically moved to the temporally corresponding position. Further, when the screen of one of the display areas is scrolled, the screen of the other display area is also scrolled. The logic analyzer of the present invention, which is equipped with these functions, is of great utility in the analysis of logic circuits.

It will be apparent that many modifications and variations may be effected without departing from the scope of the novel concepts of the present invention.

What is claimed is:

1. A logic analyzer, comprising:
   first and second data paths;
   a first data memory, coupled to said first data path, for loading first input data for each change in state of said first data memory;
   a first trigger detector, coupled to said first data path, for detecting that the first input data has reached a first preset value;
   first delay means, coupled to said first trigger detector, for delaying the detected output if the first trigger detector, for a time period equal to a time required for performing a predetermined number of data loadings into said first data memory, to provide a delayed output for stopping the data loading into the first data memory;
   a second data memory, coupled to said second data path, for loading second input data;
   a second trigger detector, coupled to said second data path, for detecting that the second input data has reached a second preset value;
   second delay means, coupled to said second trigger detector, for delaying the detected output of the second trigger detector, for a time period equal to a time required for performing a predetermined number of data loadings into said second data memory, to provide a delayed output for stopping the data loading into the second data memory;
   a first data loading interval measuring circuit, coupled to said first data memory, for measuring intervals of loading the first input data into the first data memory;
   a first data loading interval memory, coupled to said first data loading interval measuring circuit, for storing the data loading intervals measured by the first data loading interval measuring circuit;
   a time difference measuring circuit, coupled to said first and second delay means, for measuring the time difference between the points of generation of the delayed outputs from the first and second delay means;
   a time difference memory, coupled to said time difference measuring circuit, for storing the time difference measured by the time difference measuring circuit;
   data specifying means for specifying a desired one of the data stored in one of the first and second data memories; and
   corresponding data detecting means, connected to said first data loading interval memory, said time difference memory and said data specifying means, for determining data in the one of said first and said second data memories corresponding to the loading point of the specified data utilizing the time difference stored in the time difference memory and the data loading intervals stored in the first data loading interval memory.

2. A logic analyzer according to claim 1 wherein the second input data is loaded into the second data memory with a fixed period.

3. A logic analyzer according to claim 2, wherein the corresponding data detecting means comprises reference time interval computing means for computing, as a reference time interval, the time interval between the loading of the specified data and the stopping of the data loading into the one of said first and said second data memories in which the specified data is stored, and means whereby the time interval between the stopping of the data loading of the other of said first and said second data memories and each data loading thereinto and the time difference stored in the time difference memory are added including a sign, obtaining data corresponding to that one of the added values which is close to the reference time interval.

4. A logic analyzer according to claim 3 wherein the reference time interval computing means is a means whereby when the specified data is in the first data memory, the successive data loading intervals stored in the first data loading interval memory during the time between the loading of the specified data and the stopping of data loading into the first data memory, are added together to obtain the reference time interval, and whereby when the specified data is in the second data memory, the number of data inputs into the second data memory during the time between the loading of the specified data and the stopping of the data loading into the second data memory and its data loading period are multiplied to obtain the reference time interval, and wherein the corresponding data detecting means is a means whereby when the specified data is in the first data memory, a value K is obtained which makes the sum of K times the fixed data loading period of the second data memory and the stored time difference close to the reference time interval, and the Kth previous data from the last in the second data memory is output as the corresponding data, and whereby when the specified data is in the second data memory, a value K is obtained which makes the sum of the value of addition of the successive data loading intervals stored in the first data loading interval memory during the time between the loading of the last data in the first data memory and the loading of the Kth previous data therefrom and the value of the stored time difference close to the reference time interval, and the Kth data from the last in the first data memory is output as the corresponding data.

5. A logic analyzer according to claim 2 wherein the corresponding data detecting means comprises reference time interval computing means for computing, as a reference time interval, the time interval between the loading of the specified data and the later one of the data load stop times of the first and second data memories, and means for obtaining, from one of the first and second data memories having not stored therein the specified data, data corresponding to the time difference between the data loading time and the said later data load stop time, which difference is close to the reference time interval.

6. A logic analyzer according to claim 5 wherein the corresponding data obtaining means is a means whereby when the specified data is in the first data memory and the first data memory is stopped from the data loading thereinto after the second data memory, a value K is determined so that the sum of a K-fold value of the data loading period of the second data memory and the stored time difference may become close to the reference time interval and Kth data from the last in the second data memory is output as the corresponding data, whereby when the specified data is in the first data memory and the second data memory is stopped from the data loading thereinto after the first data memory, a value K is determined so that a K-fold value of the data loading period of the second data memory may become close to the reference time interval and Kth data from the last in the second data memory is output as the corresponding data, whereby when the specified data is in the second data memory and the first data memory is stopped from the data loading thereinto after the second data memory, a value K is determined so that the sum value of the successive data loading intervals stored in the first data loading interval memory during the time between the loading of the Kth data from the last and the loading of the last data, may become close to the reference time interval and the Kth data from the last in the first data memory is output as the corresponding data, and whereby when the specified data is in the second data memory and the second data memory is stopped from the data loading thereinto after the first data memory, a value K is determined so that the sum of the value of addition of the successive data loading intervals stored in the first data loading interval memory during the time between the loading of the Kth data from the last and the loading of the last data, and the value of the stored time difference may become close to the reference time interval and the Kth data from the last in the first data memory is output as the corresponding data.

7. A logic analyzer according to claim 5 wherein the reference time interval computing means is a means whereby when the specified data is in the first data memory and the first data memory is stopped from the data loading thereinto after the second data memory, the successive data loading intervals stored in the first data loading interval memory during the time between the loading of the last data into the first data memory and the loading of the specified data, are added together to obtain the reference time interval, whereby when the specified data is in the first data memory and the second data memory is stopped from the data loading thereinto after the first data memory, the sum of the successive data loading intervals stored in the first data loading interval memory during the time between the loading of the last data into the first data memory and the loading of the specified data thereinto, and the stored time difference to obtain the reference time interval, whereby when the specified data is in the second data memory and the first data memory is stopped from the data loading thereinto after the second data memory, the number of data inputs into the second data memory during the time between the loading of the specified data and the stopping of the data loading into the second data memory and its data loading period are multiplied and the multiplied value is added to the stored time difference to obtain the reference time interval, and whereby when the specified data is in the second data memory and the second data memory is stopped from the data loading thereinto after the first data loading, the number of data inputs into the second data memory during the time between the loading of the specified data and the stopping of the data loading into the second data memory and its data loading period are multiplied to obtain the reference time interval.

8. A logic analyzer according to claim 1 wherein the second input data is loaded for each change in state thereof, which further comprises a second data loading interval measuring circuit for measuring the intervals of loading of the second input data and a second data loading interval memory for storing the data loading intervals measured by the second data loading interval measuring circuit, and wherein the data loading intervals stored in the second data loading interval memory are also used for obtaining the corresponding data by the corresponding data detecting means.

9. A logic analyzer according to claim 8 wherein the corresponding data detecting means comprises reference time interval computing means for computing, as a reference time interval, the time interval between the loading of the data specified by the specifying means and the stopping of the data loading into one of the first and second data memories having stored therein the specified data, and means whereby the time interval between the stopping of the data loading into the other data memory and each data loading thereinto and the time difference stored in the time difference memory are added including its sign to obtain data corresponding to that one of the added values which is close to the reference time interval.

10. A logic analyzer according to claim 9 wherein the reference time interval computing means is a means whereby when the specified data is in the first data memory, the successive data loading intervals stored in the first data loading interval memory during the time between the loading of the specified data and the stopping of data loading into the first data memory, are added together to obtain the reference time interval, and whereby when the specified data is in the second data memory, the successive data loading intervals stored in the second data loading interval memory during the time between the loading of the specified data and the stopping of data loading into the second data memory, are added together to obtain the reference time interval, and wherein the corresponding data obtaining means is a means whereby when the specified data is in the first data memory, a value K is determined so that the sum of the value of addition of the intervals of the successive data loading intervals stored in the second data loading interval memory during the time between the loading of the last data in the second data memory and the loading of the Kth previous data therefrom and the stored time difference may become close to the reference time interval, and the Kth data from the last in the second data memory is output as the corresponding data, and whereby when the specified data is in the second data memory, a value K is determined so that the sum of the value of addition of the intervals of the successive data loading intervals stored in the first data loading interval memory during the time between the loading of the last data in the first data memory and the loading of the Kth previous data therefrom and the stored time difference may become close to the reference time interval, and the Kth data from the last in the first data memory is output as the corresponding data.

11. A logic analyzer according to claim 8 wherein the corresponding data detecting means comprises reference time interval computing means for computing, as a reference time interval, the time between the loading of the specified data and the stopping of the data loading into one of the first and second data memories which is stopped from the data loading thereinto after the other, and means for obtaining, from that one of the first and second data memories having not stored therein the specified data, data corresponding to the time difference between the data loading time and the said later data load stop time, which difference is close to the reference time interval.

12. A logic analyzer according to claim 11 wherein the reference time interval computing means is a means whereby when that one of the first and second data memories having stored therein the specified data is stopped from data loading thereinto after the other data memory, the data loading intervals stored in the data loading interval memory corresponding to the said one data memory during the time between the loading of the specified data and the stopping of data loading, are added together to obtain the reference time interval, and whereby when the data memory having stored therein the specified data is stopped from data loading thereinto before the other data memory is stopped the successive data loading intervals within the time between the loading of the specified data and the stopping of the data loading, stored in the data loading interval memory corresponding to the data memory having stored therein the specified data, and the stored time difference are added together to obtain the reference time interval, and wherein the corresponding data obtaining means is a means whereby when one of the first and second data memories having stored therein the specified data is stopped from data loading thereinto after the other data memory, a value K is determined so that the sum of the value of addition of the successive data loading intervals stored in the data loading interval memory corresponding to the said other data memory during the time between the stopping of data loading into the said other data memory and the loading of the Kth data from the last therein and the stored time difference may become close to the reference time interval, and the Kth data from the last in the data memory having not stored therein the specified data is output as the corresponding data, and whereby when the data memory having stored therein is stopped from data loading thereinto before the other data memory, a value K is determined so that the value of addition of the successive data loading intervals stored in the data loading interval memory corresponding to the said other data memory during the time between the stopping of the data loading into the said other data memory and the loading of the Kth data from the last therein may become close to the reference time interval, and the Kth data from the last in the data memory having not stored therein the specified data is output as the corresponding data.

13. A logic analyzer according to claim 1 wherein the loading of the second input data into the second data memory is effected by means for loading the second input data with a fixed period, means for loading the second input data for each change in state thereof and means for switching the both loading means, which comprises a second data loading interval measuring circuit for measuring the intervals of loading of the second input data and a second data loading interval memory for storing the data loading intervals measured by the second data loading interval measuring circuit, and wherein the corresponding data detecting means obtains the corresponding data also utilizing the data loading intervals stored in the second data loading interval memory.

14. A logic analyzer according to claims 1, 2, 8 or 13 further including trigger priority means for giving priority to only one of the first and second trigger detectors to make it operative, the other trigger detector being made operative by the output of the priority-given trigger detector.

15. A logic analyzer according to claims 1, 2, 8 or 13, further comprising first display means for displaying data transferred from the first data memory, first transfer means for transferring data from the first data memory to the first display means, first cursor control means capable of indicating the data displayed on the display means by a first cursor and changing the position of indication by the first cursor, second display means for display data transferred from the second data memory, second transfer means for transferring the data from the second data memory to the second display means, second cursor control means capable of indicating the data displayed on the display means by a second cursor and changing the position of indication by the second cursor, and cursor interconnecting means whereby when the position of indication by one of the first and second cursors is changed, data at the new position is obtained, as the specified data, by the corresponding data detecting means, and the other cursor is caused to indicate the corresponding data.

16. A logic analyzer according to claim 15 further comprising means which when the data to be indicated by the other cursor under control of the cursor interconnecting means is not present in the display means which is to display the data, includes means for rendering the corresponding data transfer means to transfer the data from the corresponding data memory to the corresponding display means.

17. A logic analyzer according to claims 1, 2, 8 or 13 further comprising first display means for displaying data transferred from the first data memory, first transfer means for transferring the data from the first data memory to the first display means, second display means for displaying data transferred from the second data memory, second transfer means for transferring the data from the second data memory to the second display means, scroll means for driving the first or second transfer means to update and display data on the first or second display means, and scroll associating means which obtains the corresponding data in the second or first data memory by the corresponding data detecting means using, as the specified data, data at a predetermined position on the display screen of the first or second display means and drives the second or first transfer means so that the corresponding data is displayed at a predetermined position on the second or first display means.

18. A logic analyzer according to claim 17 for indicating the predetermined position on the display screen of the first display means by the first cursor and capable of changing the predetermined position by changing the position of indication by the first cursor, and second cursor control means for indicating the predetermined position on the display screen of the second display means by the second cursor and capable of changing the predetermined position by changing the position of indication by the second cursor.

19. A logic analyzer, comprising:
first and second data aquisition means for receiving first and second trains of input data and producing trains of first and second sample data, respectively;
first and second data memory means, coupled to said first and second data acquisition means, respectively, for successively loading thereinto, at specific addresses, said first and second sample data, respectively;
first and second trigger detecting means, coupled to said first and second data acquisition means, respectively, for detecting coincidence between sample data in the trains of said first and second sample data and first and second trigger data, and producing first and second detection outputs, respectively;

first and second delay means, coupled to said first and second trigger detecting means, respectively, for delaying the first and second detection outputs therefrom until predetermined numbers of said first and second sample data are loaded into said first and second data memory means after occurrences of said first and second detection outputs, respectively, the output sides of said first and second delay means being coupled to said first and second data memory means, respectively, and the delayed outputs stopping the loading of said first and second sample data into said first and second memory means, respectively;

a loading interval measuring means, coupled to said first data acquisition means, for measuring successive loading intervals of said first sample data to be loaded into said first data memory means;

a time difference measuring means, coupled to said first and second delay means, for measuring a time difference between occurrences of the delayed outputs from said first and second delay means; and address selecting means, coupled to said first loading interval measuring means and said time difference measuring means, for selecting the address of the one of said first and second data memory means loaded immediately prior to the other one of said first and second data memory means based on the time difference and the loading intervals measured by said time difference measuring means and said loading interval measuring means, respectively.

20. A logic analyzer, comprising:

first and second data aquisition means for receiving first and second trains of input data and producing trains of first and second sample data, respectively;

first and second data memory means, coupled to said first and second data acquisition means, respectively, for successively loading thereinto, at a specific addressed, said first and second sample data, respectively;

first and second trigger detecting means, coupled to said first and second data acquisition means, respectively, for detecting coincidence between sample data in the trains of said first and second sample data and first and second trigger data, and producing first and second detection outputs, respectively;

first and second delay means, coupled to said first and second trigger detecting means, respectively, for delaying first and second detection outputs therefrom until predetermined numbers of said first and second sample data are loaded into said first and second data memory means after occurrences of said first and second detection outputs, respectively, the output sides of said first and second delay means being being coupled to said first and second data memory means, respectively, and the delayed outputs stopping the loading of said first and second sample data into said first and second memory means, respectively;

first loading interval measuring means, coupled to said first data acquisition means, for measuring successive loading intervals of said first sample data to be loaded into said first data memory means;

time difference measuring means, coupled to said first and second trigger detecting means, for measuring a time difference between said first and second sample data defined between detection outputs and delayed outputs of said first and second trigger detecting means and said first and second delay means, respectively; and address selecting means, coupled to said first loading interval measuring means, for receiving the time difference and the loading intervals from said time difference measuring means and said first loading interval measuring means and selecting the address of the one of said first and second data memory means loaded immediately prior to the other one of said first and second data memory means based on the time difference and the loading intervals.

21. A logic analyzer according to claim 19 or 20, further comprising second loading interval measuring means, coupled to said second data acquisition means, for measuring successive intervals of said second sample data to be loaded into said second data memory means, wherein said address selecting means is also coupled to said second loading interval measuring means and selects one of addresses in the other one of said first and second data memory means based on the time difference and the loading intervals of said first and second sample data.

22. A logic analyzer according to claim 19 or 20, wherein said second data acquisition produces a train of said second sample data at predetermined fixed intervals, and said address selecting means selects the address of one of said first and second data memory means loaded immediately prior to the other one of said first and second data memory means based on the time difference and the loading intervals of said first and second sample data.

23. A logic analyzer, comprising:

first data control means for storing data blocks and outputting data blocks after a predetermined time delay;

second data control means for storing data blocks and outputting data blocks after a predetemined time delay;

loading means for loading data blcoks to be stored into said first and second data control means;

interval measuring means, coupled to said first data control means, for measuring intervals of time elapsed when said loading means loads data into said first data control means and storing the measured intervals;

time difference measuring means, coupled to said first and second data control means, for measuring a time difference between delayed outputs of data blocks from said first and second data control means, and storing data corresponding to the time difference; and data specifying means, coupled to said interval measuring means and said time difference measuring means, for specifying a particular block of data loaded into one of said first and second data control means and determining the data block corresponding to said specified block of data in said other of said first and second data control means.

* * * * *